(12) United States Patent
Horii

(10) Patent No.: US 9,048,093 B2
(45) Date of Patent: Jun. 2, 2015

(54) METHOD FOR MANUFACTURING SILICON CARBIDE SEMICONDUCTOR DEVICE

(71) Applicant: Sumitomo Electric Industries, Ltd., Osaka-shi (JP)

(72) Inventor: Taku Horii, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 11 days.

(21) Appl. No.: 13/767,573

(22) Filed: Feb. 14, 2013

(65) Prior Publication Data

US 2013/0252400 A1 Sep. 26, 2013

Related U.S. Application Data

(60) Provisional application No. 61/613,701, filed on Mar. 21, 2012.

(30) Foreign Application Priority Data

Mar. 21, 2012 (JP) .................................. 2012-063035

(51) Int. Cl.
| | |
|---|---|
| *H01L 21/30* | (2006.01) |
| *H01L 21/02* | (2006.01) |
| *H01L 21/20* | (2006.01) |
| *H01L 29/66* | (2006.01) |
| *H01L 29/78* | (2006.01) |
| *H01L 21/683* | (2006.01) |

(52) U.S. Cl.
CPC ...... *H01L 21/02529* (2013.01); *H01L 21/2007* (2013.01); *H01L 29/6606* (2013.01); *H01L 29/66068* (2013.01); *H01L 29/7802* (2013.01); *H01L 21/6835* (2013.01); *H01L 2221/68381* (2013.01)

(58) Field of Classification Search
None
See application file for complete search history.

(56) References Cited

U.S. PATENT DOCUMENTS

| | | | |
|---|---|---|---|
| 7,510,986 B2 * | 3/2009 | Miura | 438/796 |
| 2007/0082427 A1 * | 4/2007 | Shirahama et al. | 438/105 |
| 2009/0081880 A1 * | 3/2009 | Yoshie | 438/745 |
| 2009/0133819 A1 | 5/2009 | Moriceau et al. | |
| 2011/0101413 A1 * | 5/2011 | Song | 257/103 |

(Continued)

FOREIGN PATENT DOCUMENTS

| | | |
|---|---|---|
| JP | 2000-277405 A | 10/2000 |
| JP | 2009-239251 A | 10/2009 |

(Continued)

OTHER PUBLICATIONS

International Search Report and Written Opinion in International Patent Application No. PCT/JP2013/052537 dated Apr. 9, 2013.

*Primary Examiner* — Scott B Geyer
(74) *Attorney, Agent, or Firm* — Venable LLP; Michael A. Sartori; Tamatane J. Aga

(57) ABSTRACT

A single crystal substrate made of silicon carbide and a first support substrate having a size greater than a size of each of the single crystal substrates are prepared. The single crystal substrate is bonded onto the first support substrate. Process on the single crystal substrate bonded to the first support substrate is performed. The first support substrate is removed. The single crystal substrate is subjected to heat treatment. The single crystal substrate is bonded onto a second support substrate having a size greater than the size of the single crystal substrate. Process on the single crystal substrate bonded to the second support substrate is performed.

25 Claims, 20 Drawing Sheets

(56) References Cited

U.S. PATENT DOCUMENTS

2011/0227068 A1 9/2011 Akiyama
2012/0056202 A1 3/2012 Wada et al.

FOREIGN PATENT DOCUMENTS

JP 2010-161355 A 7/2010
WO WO-2010/131572 A1 11/2010

* cited by examiner

FIG.3
(A)
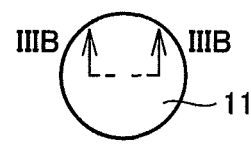
(B)
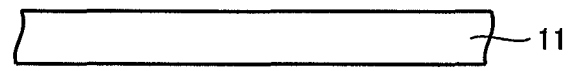

FIG.4
(A)
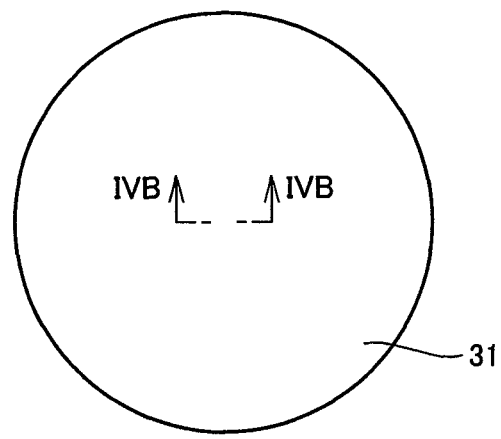
(B)
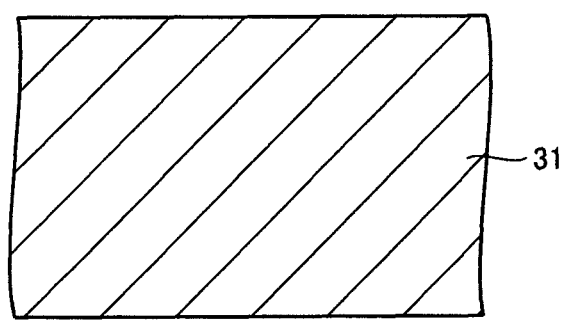

FIG. 7
(A)
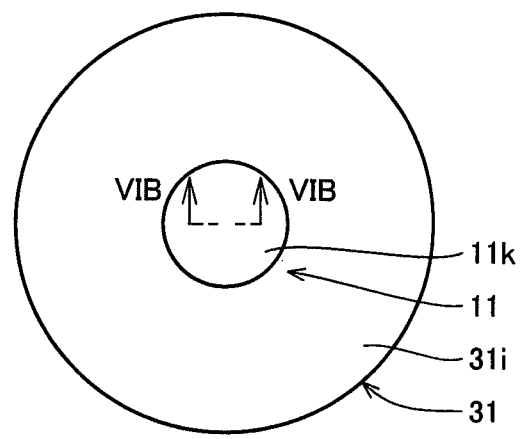
(B)
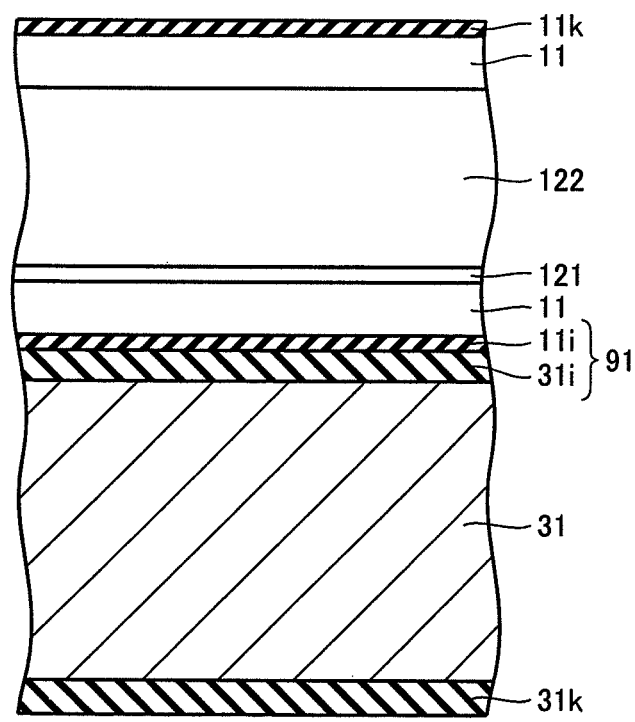

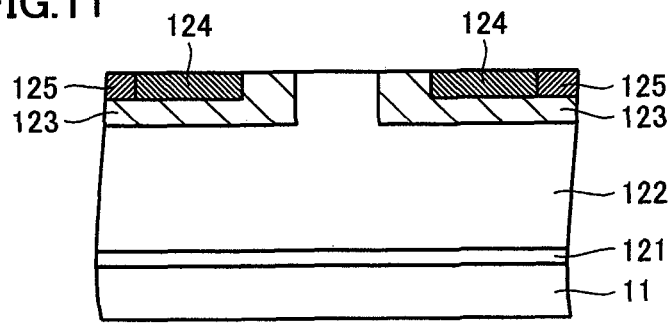
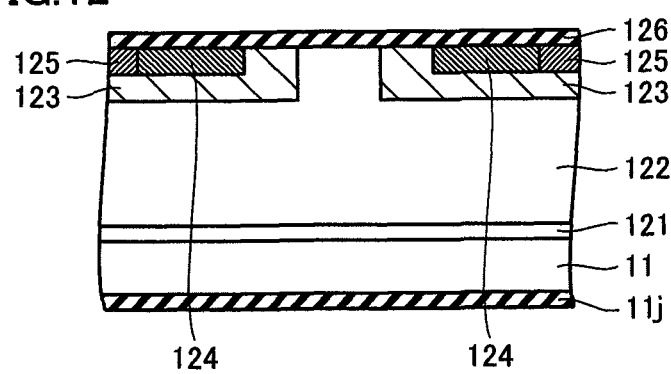
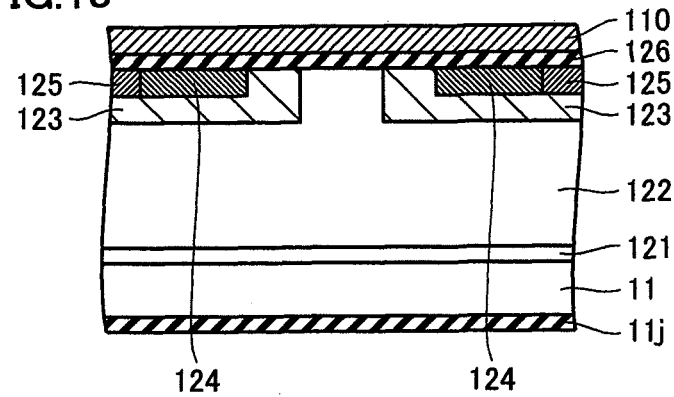

FIG.20
(A)
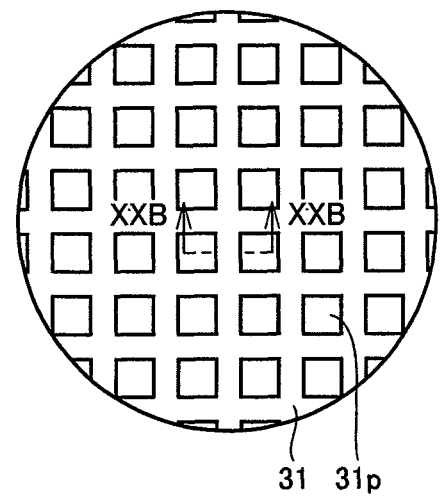
(B)
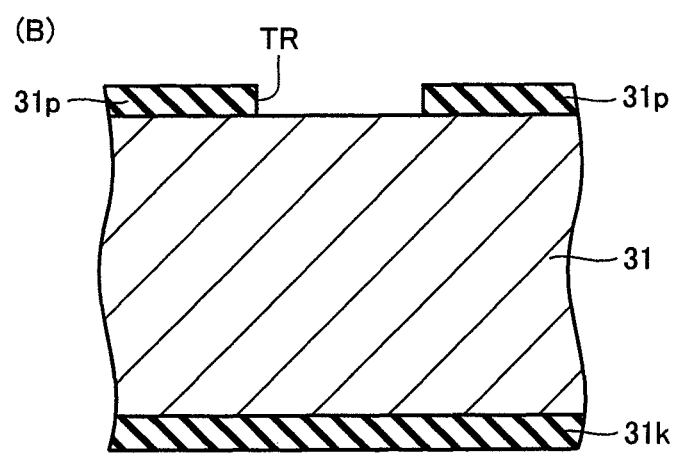

FIG.21
(A)
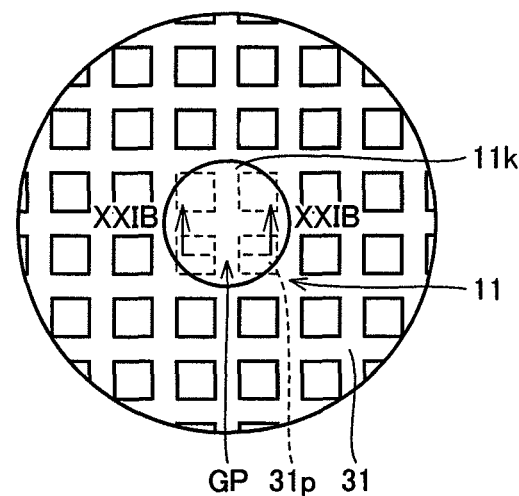
(B)
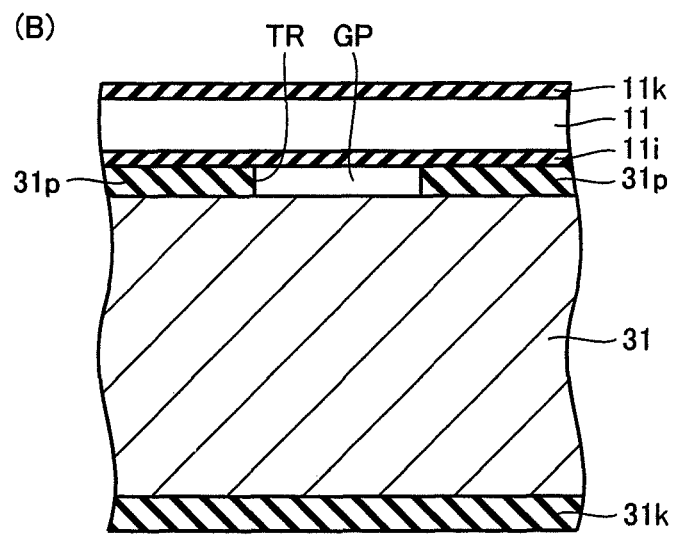

FIG.23
(A)
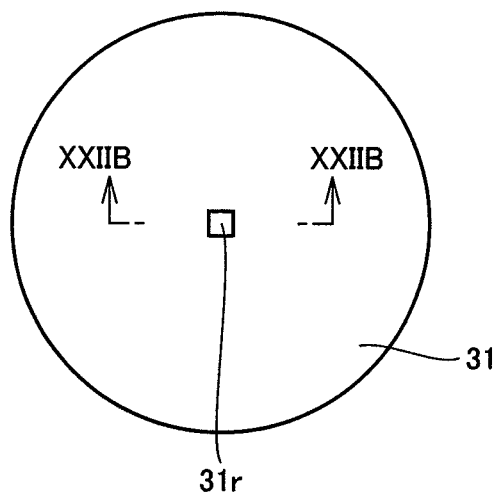
(B)
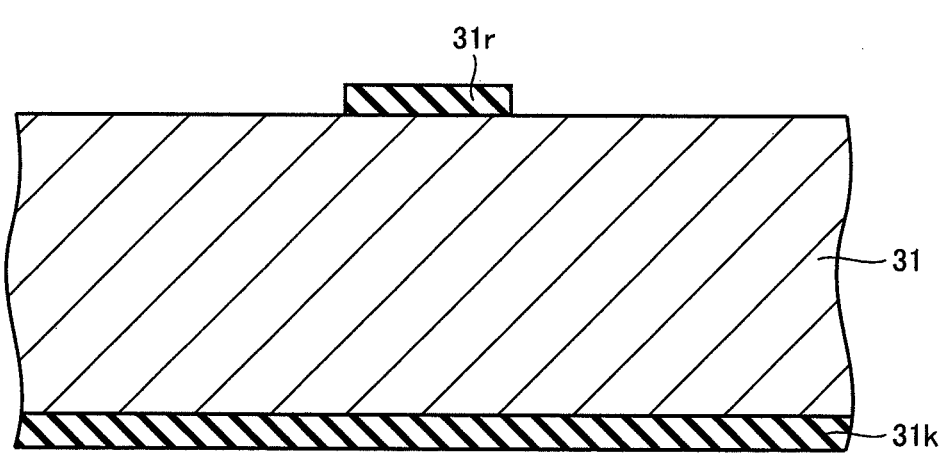

FIG.24
(A)
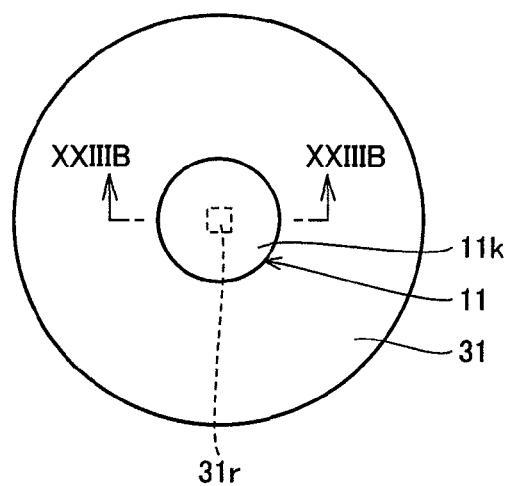
(B)
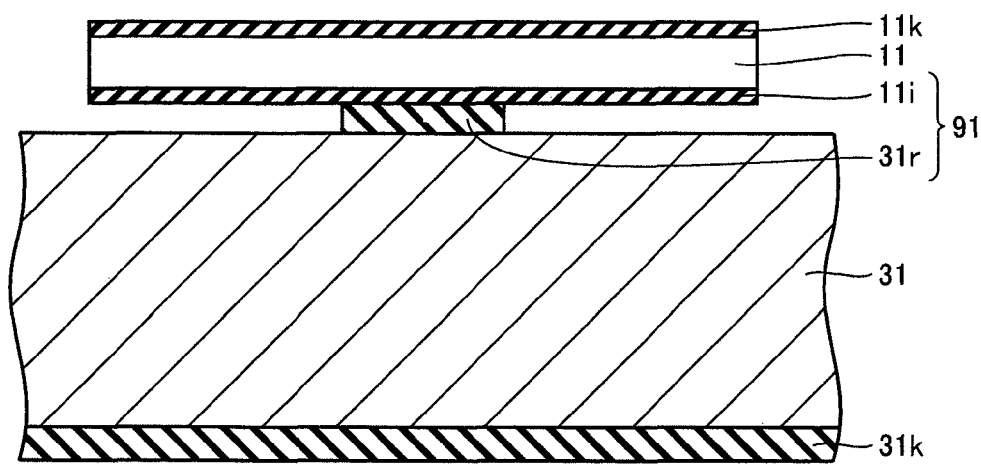

METHOD FOR MANUFACTURING SILICON CARBIDE SEMICONDUCTOR DEVICE

BACKGROUND OF THE INVENTION

1. Field of the Invention

The present invention relates to a method for manufacturing a silicon carbide semiconductor device, and particularly to a method for manufacturing a silicon carbide semiconductor device having heat treatment.

2. Description of the Background Art

Most of general semiconductor manufacturing apparatuses for mass production are adapted to large-sized silicon substrates based on the specifications standardized in the field of a semiconductor, and they are normally designed to handle substrates having a size not smaller than approximately 150 mm (6 inches). Meanwhile, industrially, a high-quality single crystal silicon carbide substrate has a size not greater than approximately 100 mm (4 inches). Then, in order to adapt a silicon carbide substrate to a general semiconductor manufacturing apparatus, it has been proposed to support a silicon carbide substrate on a support substrate greater than that. For example, according to the technique described in Japanese Patent Laying-Open No. 2000-277405, it has been proposed to provide an SiC wafer on an Si wafer.

In manufacturing a semiconductor device, heat treatment is normally required. In particular, activation heat treatment for activating an impurity introduced through ion implantation requires a high temperature. A temperature for activation heat treatment in the case of a silicon carbide substrate is significantly higher than in the case of a silicon substrate, and for example, it is around 1800° C. This temperature is high enough to melt silicon and silicon oxide. Thus, manufacturing of a semiconductor device including a silicon carbide substrate, that is, manufacturing of a silicon carbide semiconductor device, requires heat treatment at a very high temperature. When the technique described in the publication above is used for manufacturing a silicon carbide semiconductor device requiring heat treatment at a high temperature as such, an Si wafer supporting an SiC wafer cannot withstand a heat treatment temperature.

SUMMARY OF THE INVENTION

The present invention was made in view of the above-described problems and its object is to provide a method for manufacturing a silicon carbide semiconductor device capable of adapting to a size of a substrate which can be handled by a semiconductor manufacturing apparatus and allowing heat treatment at a high temperature of a substrate made of silicon carbide in manufacturing of a semiconductor device including a single crystal substrate made of silicon carbide.

A method for manufacturing a silicon carbide semiconductor device according to the present invention has the following steps. At least one single crystal substrate made of silicon carbide and a first support substrate having a size greater than a size of each of the at least one single crystal substrate are prepared. Each of the at least one single crystal substrate is bonded onto the first support substrate. Process on the at least one single crystal substrate bonded to the first support substrate is performed. The first support substrate is removed after the step of performing process on the at least one single crystal substrate. The at least one single crystal substrate is subjected to heat treatment after the step of removing the first support substrate. Each of the at least one single crystal substrate is bonded onto a second support substrate having a size greater than the size of each of the at least one single crystal substrate after the step of subjecting the at least one single crystal substrate to heat treatment. Process on the at least one single crystal substrate bonded to the second support substrate is performed.

According to the method for manufacturing a silicon carbide semiconductor device in the present invention, after the first support substrate is removed and before the second substrate is bonded, the single crystal substrate made of silicon carbide is subjected to heat treatment. Therefore, this single crystal substrate can be subjected to heat treatment at a high temperature which the first or second support substrate cannot withstand. In addition, by using the first and second support substrates, adaptation to a size of a substrate which can be handled by a semiconductor manufacturing apparatus is enabled before and after heat treatment.

In the manufacturing method above, an interposing portion made of a material different from each of silicon carbide and a material for the first support substrate may be formed on at least any of each of the at least one single crystal substrate and the first support substrate. In this case, the step of bonding each of the at least one single crystal substrate may be performed by bonding each of the at least one single crystal substrate onto the first support substrate with the interposing portion being interposed.

Thus, the single crystal substrate can be bonded without adhesion between silicon carbide and the material for the first support substrate.

In the manufacturing method above, the step of removing the first support substrate may include the step of removing the interposing portion.

By removing the interposing portion, the first support substrate can readily be detached.

In the manufacturing method above, the step of removing the interposing portion may be performed through wet etching.

Thus, the interposing portion can readily be removed.

In the manufacturing method above, the step of forming an interposing portion may include the step of forming on the first support substrate, a support-side-coating layer as at least a part of the interposing portion.

Thus, at least a part of the interposing portion can be formed through treatment of the first support substrate.

The first support substrate may be made of polycrystalline silicon carbide.

Thus, a coefficient of thermal expansion of the first support substrate becomes closer to a coefficient of thermal expansion of the single crystal substrate. Therefore, generation of stress originating from difference in coefficient of thermal expansion between these can be suppressed.

In the manufacturing method above, the step of forming a support-side-coating layer may include the step of depositing the support-side-coating layer on the first support substrate.

Thus, depending of selection of a material to be deposited, a material for the support-side-coating layer can be selected.

In the manufacturing method above, the support-side-coating layer may be subjected to heat treatment at a temperature higher than a highest temperature in the step of performing process on the at least one single crystal substrate bonded to the first support substrate, before the step of performing process on the at least one single crystal substrate bonded to the first support substrate.

Thus, the single crystal substrate can be prevented from peeling off from the first support substrate while process on at least one single crystal substrate bonded to the first support substrate is performed.

In the manufacturing method above, the support-side-coating layer may be subjected to heat treatment at a temperature not lower than 1100° C. before the step of performing process on the at least one single crystal substrate bonded to the first support substrate.

Thus, the single crystal substrate can be prevented from peeling off from the first support substrate while process on at least one single crystal substrate bonded to the first support substrate is performed.

In the manufacturing method above, the step of forming a support-side-coating layer may include the step of polishing a surface of the support-side-coating layer.

Thus, strength of bonding to the support-side-coating layer can be enhanced.

In the manufacturing method above, the step of forming a support-side-coating layer may be performed to form the support-side-coating layer made of an oxide.

Thus, at least a part of the interposing portion can be formed from an oxide layer.

The support-side-coating layer made of an oxide may be formed through thermal oxidation of the first support substrate.

Thus, an oxide layer as at least a part of the interposing portion can readily be formed.

In the manufacturing method above, the first support substrate may be made of single crystal silicon.

Thus, planarity of the first support substrate can readily be enhanced.

In the manufacturing method above, the step of forming an interposing portion may include the step of forming a single-crystal-side-coating layer as at least a part of the interposing portion on each of the at least one single crystal substrate.

Thus, at least a part of the interposing portion can be formed through treatment of each of at least one single crystal substrate.

The step of forming a single-crystal-side-coating layer may include the step of depositing the single-crystal-side-coating layer on each of the at least one single crystal substrate.

Thus, depending on selection of a material to be deposited, a material for the single-crystal-side-coating layer can be selected.

The step of forming a single-crystal-side-coating layer may include the step of polishing a surface of the single-crystal-side-coating layer.

Thus, strength of bonding to the single-crystal-side-coating layer can be enhanced.

In the manufacturing method above, the single-crystal-side-coating layer may be formed through thermal oxidation of each of the at least one single crystal substrate.

Thus, an oxide layer as at least a part of the interposing portion can readily be formed.

In the manufacturing method above, the step of forming an interposing portion may include the step of patterning the interposing portion.

Thus, an unnecessary portion of the interposing portion can be removed.

In the manufacturing method above, the step of bonding each of the at least one single crystal substrate may be performed to form a gap through patterning of the interposing portion, between each of the at least one single crystal substrate and the first support substrate.

As the gap is provided, internal stress can be suppressed.

The step of bonding each of the at least one single crystal substrate may be performed to seal the gap.

As the gap is sealed, foreign matters can be prevented from entering the gap. In addition, if wet etching is employed, once an etchant reaches the gap, the etchant rapidly diffuses through the gap. Therefore, wet etching can efficiently be carried out.

In the manufacturing method above, the step of bonding each of the at least one single crystal substrate may be performed such that the gap communicates with the outside.

In this case, by externally supplying the etchant into the gap, wet etching of the interposing portion can efficiently be carried out.

In the manufacturing method above, the step of bonding each of the at least one single crystal substrate may be performed by directly bonding each of the at least one single crystal substrate onto the first support substrate.

Thus, bonding can be achieved without using the interposing portion.

In the manufacturing method above, the first support substrate may be made of an oxide.

Thus, removal of the first support substrate can be carried out as removal of the oxide.

In the manufacturing method above, the step of performing process on the at least one single crystal substrate bonded to the first support substrate may include the step of implanting an impurity into the at least one single crystal substrate. In this case, the step of subjecting the at least one single crystal substrate to heat treatment may be performed to activate the impurity.

In this case, heat treatment for activating the impurity implanted into at least one single crystal substrate made of silicon carbide can be performed, and damage attributed to a high temperature in this heat treatment to the first and second support substrates can be avoided.

In the manufacturing method above, the at least one single crystal substrate may include a plurality of single crystal substrates.

Thus, a ratio of a portion formed from the single crystal substrate made of silicon carbide on the first or second support substrate can be raised. Therefore, efficiency in manufacturing a silicon carbide semiconductor device can be enhanced.

In the manufacturing method above, the second support substrate may be removed.

As the second support substrate is removed, a size of the silicon carbide semiconductor device can be reduced.

It is noted that, in the description above, the case where the number of "at least one single crystal substrate" is one, the expression "each of the at least one single crystal substrate" means this single crystal substrate.

As described above, according to the present invention, in manufacturing of a semiconductor device including a single crystal substrate made of silicon carbide, adaptation to a size of a substrate which can be handled by a semiconductor manufacturing apparatus can be achieved and heat treatment at a high temperature of a substrate made of silicon carbide can be performed.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 3 is (A) a plan view and (B) a cross-sectional view schematically showing a single crystal substrate in a first step in the method for manufacturing a silicon carbide semiconductor device in Embodiment 1 of the present invention.

FIG. 4 is (A) a plan view and (B) a cross-sectional view schematically showing a first support substrate in the first step in the method for manufacturing a silicon carbide semiconductor device in Embodiment 1 of the present invention.

FIG. 5 is a cross-sectional view schematically showing a second step in the method for manufacturing a silicon carbide semiconductor device in Embodiment 1 of the present invention.

FIG. 7 is (A) a plan view and (B) a cross-sectional view schematically showing a fourth step in the method for manufacturing a silicon carbide semiconductor device in Embodiment 1 of the present invention.

FIG. 11 is a cross-sectional view schematically showing an eighth step in the method for manufacturing a silicon carbide semiconductor device in Embodiment 1 of the present invention.

FIG. 12 is a cross-sectional view schematically showing a ninth step in the method for manufacturing a silicon carbide semiconductor device in Embodiment 1 of the present invention.

FIG. 13 is a cross-sectional view schematically showing a tenth step in the method for manufacturing a silicon carbide semiconductor device in Embodiment 1 of the present invention.

FIG. 20 is (A) a plan view and (B) a cross-sectional view schematically showing a first step in the method for manufacturing a silicon carbide semiconductor device in Embodiment 2 of the present invention.

FIG. 21 is (A) a plan view and (B) a cross-sectional view schematically showing a second step in the method for manufacturing a silicon carbide semiconductor device in Embodiment 2 of the present invention.

FIG. 23 is (A) a plan view and (B) a cross-sectional view schematically showing a first step in the method for manufacturing a silicon carbide semiconductor device in Embodiment 4 of the present invention.

FIG. 24 is (A) a plan view and (B) a cross-sectional view schematically showing a second step in the method for manufacturing a silicon carbide semiconductor device in Embodiment 4 of the present invention.

DESCRIPTION OF THE PREFERRED EMBODIMENTS

An embodiment of the present invention will be described hereinafter with reference to the drawings. It is noted that, in crystallographic description herein, an individual plane and a collective plane are shown in ( ) and { }, respectively. Moreover, a negative index should be denoted by a number with a bar "–" thereabove, however, a negative sign herein precedes a number instead.

Embodiment 1

Figure 1:
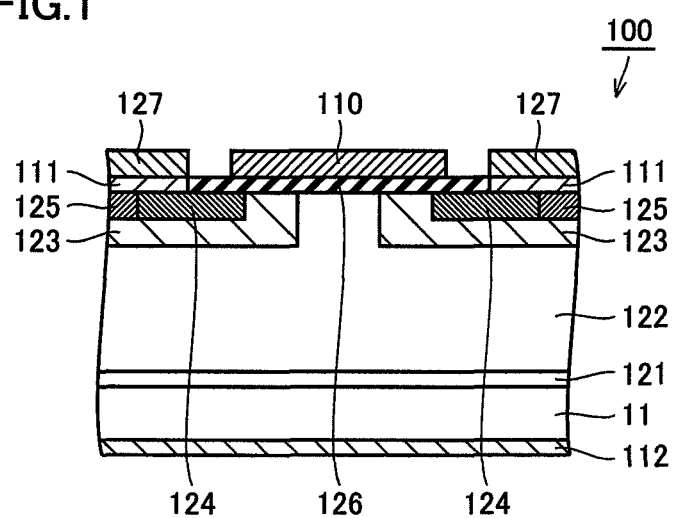
FIG. 1 is a cross-sectional view schematically showing a construction of a silicon carbide semiconductor device in Embodiment 1 of the present invention.

As shown in FIG. 1, a semiconductor device 100 (silicon carbide semiconductor device) in the present embodiment is a vertical DiMOSFET (Double implanted Metal Oxide Semiconductor Field Effect Transistor), and it has an SiC substrate 11 (single crystal substrate), a buffer layer 121, a reverse breakdown voltage holding layer 122, a p region 123, an n$^+$ region 124, a p$^+$ region 125, a gate oxide film 126, a source electrode 111, an upper source electrode 127, a gate electrode 110, and a drain electrode 112.

SiC substrate 11 is a single crystal substrate made of silicon carbide. Preferably, SiC substrate 11 has hexagonal crystal structure, and more preferably, one surface (an upper surface in the drawings) of SiC substrate 11 is a (0001) plane (that is, an Si plane), a (000-1) plane (that is, a C plane), or a plane inclined by 50° or more with respect to a {0001} plane. As a plane inclined by 50° or more with respect to the {0001} plane, a {0-33-8} plane is preferred and a (0-33-8) plane is more preferred. SiC substrate 11 has an n conductivity type in the present embodiment. SiC substrate 11 has a thickness, for example, not greater than approximately 400 μm and it may be, for example, approximately from 100 to 150 μm.

Drain electrode 112 is an ohmic electrode provided on the other surface (a lower surface in the drawing) of SiC substrate 11.

Buffer layer 121 and reverse breakdown voltage holding layer 122 are silicon carbide layers having an n-type formed epitaxially in this order on the upper surface of SiC substrate 11. Buffer layer 121 has a thickness, for example, of 0.5 μm. Further, concentration of an impurity in buffer layer 121 is, for example, $5 \times 10^{17}$ cm$^{-3}$. Reverse breakdown voltage holding layer 122 is formed on SiC substrate 11 with buffer layer 121 being interposed. Reverse breakdown voltage holding layer 122 has a thickness, for example, of 10 μm. Concentration of an impurity in reverse breakdown voltage holding layer 122 is, for example, $5 \times 10^{15}$ cm$^{-3}$.

In reverse breakdown voltage holding layer 122, a plurality of p regions 123 are formed at a distance from each other. In each of p regions 123, n$^+$ region 124 is formed as being spaced apart from reverse breakdown voltage holding layer 122 by p region 123. Further, p$^+$ region 125 is also formed in each of p regions 123.

Gate oxide film 126 covers reverse breakdown voltage holding layer 122 and p region 123 which separates n$^+$ region 124. In addition, gate oxide film 126 is patterned so as to expose each of n$^+$ region 124 and p$^+$ region 125.

Gate electrode 110 is provided on gate oxide film 126. Gate electrode 110 is made, for example, of polysilicon to which an impurity has been added. Source electrode 111 is arranged to be in contact with each of n$^+$ region 124 and p$^+$ region 125. Upper source electrode 127 is provided on source electrode 111.

A method for manufacturing semiconductor device 100 will now be described hereinafter.

As shown in FIGS. 3 (A), (B) and 4 (A), (B), as a step S10 (FIG. 2), SiC substrate 11 (single crystal substrate) and an Si substrate 31 (first support substrate) are prepared. A size in a plan view of SiC substrate 11 (a field of view in FIG. 3 (A)) is, for example, not greater than approximately 100 mm (4 inches) at the maximum dimension. Si substrate 31 is made of single crystal silicon. A size of Si substrate 31 is greater than a size of SiC substrate 11 and Si substrate 31 preferably has a maximum dimension not smaller than approximately 150 mm (6 inches). For example, a 6-inch Si wafer or an 8-inch Si wafer normally employed in the field of a semiconductor can be employed as Si substrate 31.

As shown in FIG. 5, buffer layer 121 and reverse breakdown voltage holding layer 122 are formed on SiC substrate 11 in this order. Buffer layer 121 and reverse breakdown voltage holding layer 122 can be formed through epitaxial growth using CVD (Chemical Vapor Deposition) on SiC substrate 11. A temperature employed in CVD is set to a temperature lower than a melting point of Si substrate 31.

Figure 6:
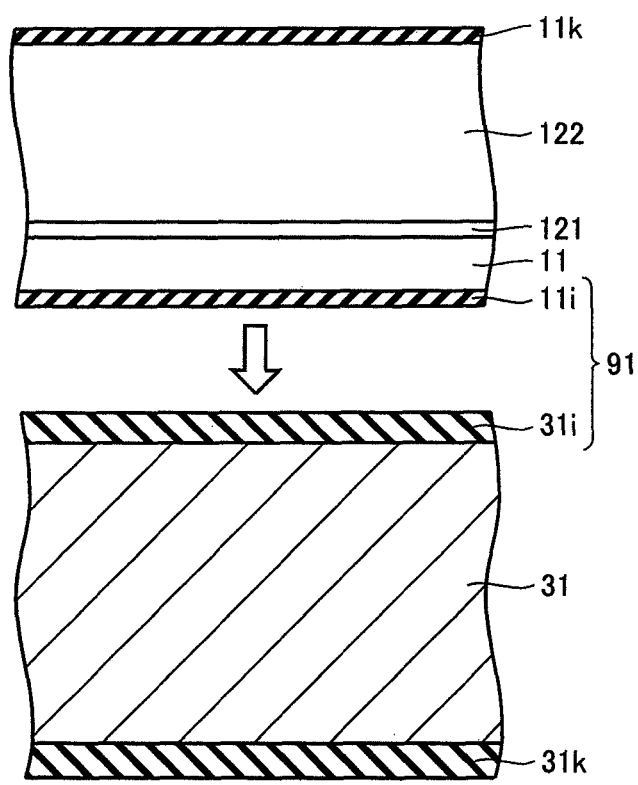
FIG. 6 is a cross-sectional view schematically showing a third step in the method for manufacturing a silicon carbide semiconductor device in Embodiment 1 of the present invention.

As shown in FIG. 6, as a step S20 (FIG. 2), an interposing portion 91 made of a material different from each of silicon carbide and a material for Si substrate 31 (more generally, a material for the first support substrate) is formed. A material for interposing portion 91 is preferably a material wet-etched more readily than silicon carbide. In addition, a material for interposing portion 91 is preferably a material wet-etched more readily than a material for Si substrate 31.

In the present embodiment, interposing portion 91 made of an oxide is formed. Specifically, as interposing portion 91, an oxide film 31i (support-side-coating layer) is formed on an upper surface of Si substrate 31 and an oxide film 11i (single-crystal-side-coating layer) is formed on a lower surface of SiC substrate 11. Oxide film 31i can be formed through thermal oxidation of Si substrate 31, and in this case, an oxide film 31k may be formed as the lower surface of Si substrate 31 is oxidized. A thermally oxidized film formed on Si substrate 31 has a thickness, for example, not smaller than 50 nm and not greater than 1μ. Oxide film 11i can be formed through thermal oxidation of SiC substrate 11, and in this case, an oxide film 11k may be formed as a surface of reverse breakdown voltage holding layer 122 is oxidized. A thermally oxidized film formed on SiC substrate 11 has a thickness, for example, not greater than 200 nm.

Then, as a step S30 (FIG. 2), SiC substrate 11 (single crystal substrate) is bonded onto Si substrate 31 (first support substrate) with interposing portion 91 being interposed. In the present embodiment, bonding between oxide film 11i and oxide film 31i, that is, SiO$_2$ bonding, is carried out.

Specifically, initially, each of oxide films 11i and 31i is activated as a result of irradiation with plasma. Then, each of oxide films 11i and 31i is subjected to megasonic cleaning. Then, as shown with an arrow in FIG. 6, oxide films 11i and 31i are brought closer to each other, so that both of them adhere to each other as a result of van der Waals forces as shown in FIG. 7. Then, as oxide films 11i and 31i are heated to around 300° C., bonding force between them is strengthened. Bonding of SiC substrate 11 onto Si substrate 31 is thus achieved.

Then, as a step S40 (FIG. 2), in order to manufacture semiconductor device 100 (FIG. 1), process on SiC substrate 11 (single crystal substrate) bonded to Si substrate 31 is performed. Specifically, steps in a first half of a semiconductor manufacturing process are performed on SiC substrate 11 as follows.

Figure 8:
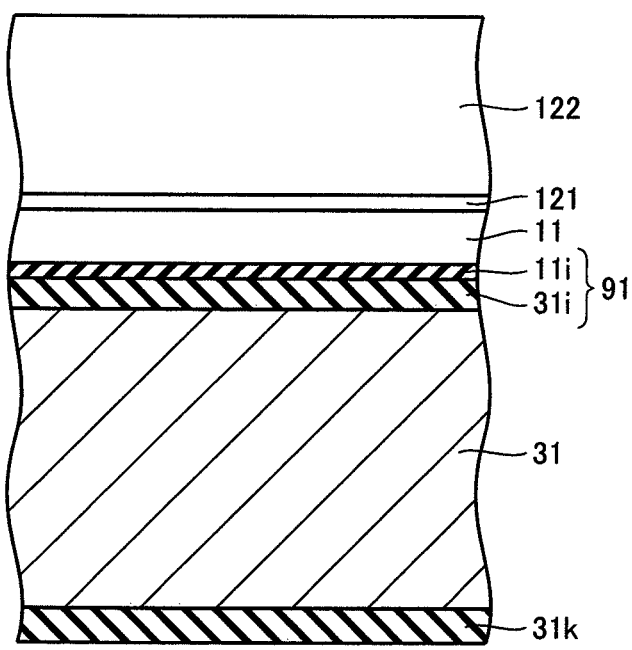
FIG. 8 is a cross-sectional view schematically showing a fifth step in the method for manufacturing a silicon carbide semiconductor device in Embodiment 1 of the present invention.

As shown in FIG. 8, oxide film 11k (FIG. 7) on reverse breakdown voltage holding layer 122 provided on SiC substrate 11 is removed.

Figure 9:
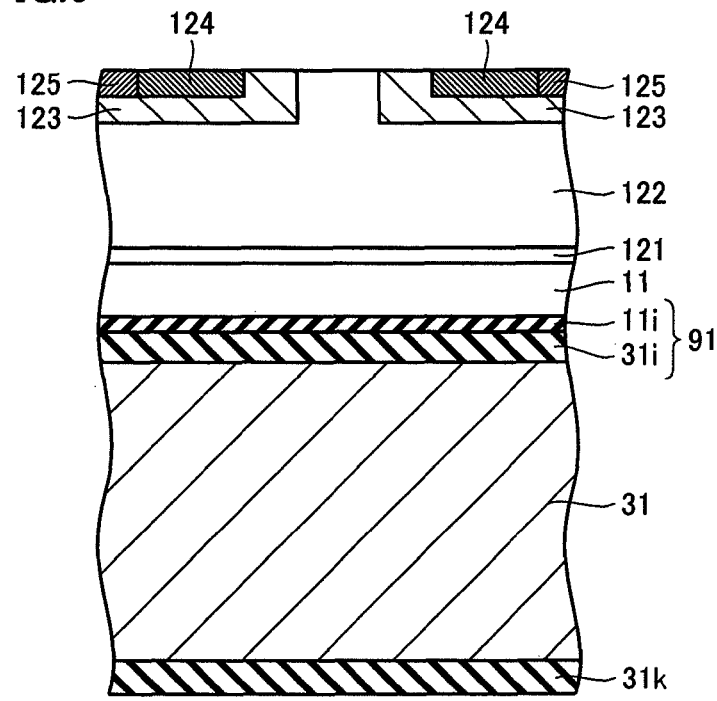
FIG. 9 is a cross-sectional view schematically showing a sixth step in the method for manufacturing a silicon carbide semiconductor device in Embodiment 1 of the present invention.

As shown in FIG. 9, by implanting impurities into reverse breakdown voltage holding layer 122 provided on SiC substrate 11, p region 123, n$^+$ region 124, and p$^+$ region 125 are formed.

As above, process on SiC substrate 11 (single crystal substrate) as step S40 (FIG. 2) is performed.

Figure 10:
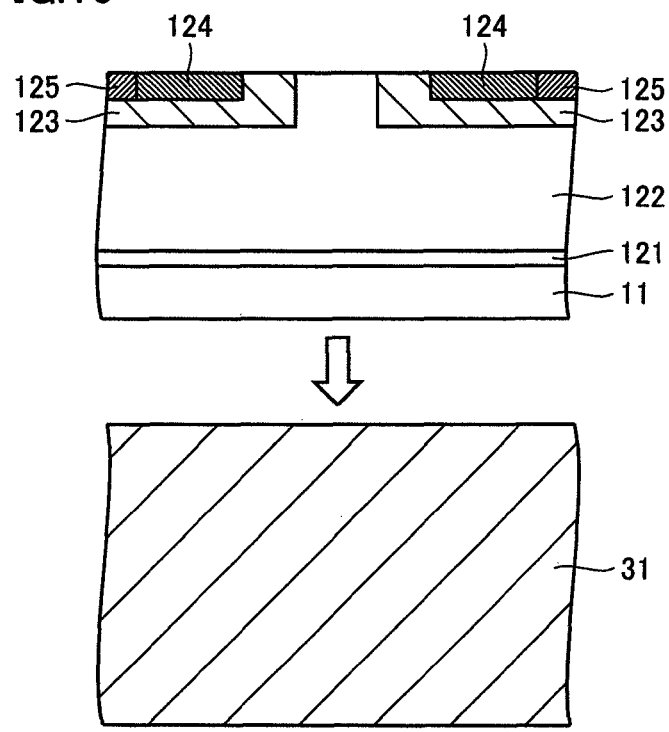
FIG. 10 is a cross-sectional view schematically showing a seventh step in the method for manufacturing a silicon carbide semiconductor device in Embodiment 1 of the present invention.

As shown in FIGS. 10 and 11, as a step S50 (FIG. 2), Si substrate 31 (first support substrate) is removed. Si substrate 31 is removed by removing interposing portion 91 (FIG. 9). As interposing portion 91 is removed, Si substrate 31 is separated from SiC substrate 11. Interposing portion 91 may be removed through wet etching using hydrofluoric acid (an aqueous solution of hydrogen fluoride) as an etchant. By employing hydrofluoric acid as the etchant, oxide films 31i and 11i made of an oxide can quickly be etched while etching of SiC substrate 11 and Si substrate 31 is suppressed.

Then, as a step S60 (FIG. 2), SiC substrate 11 (single crystal substrate) is subjected to heat treatment so as to activate the impurities in p region 123, n$^+$ region 124, and p$^+$ region 125. Preferably, a temperature for heat treatment is preferably not lower than 1500° C., more preferably not lower than 1700° C., and for example around 1800° C.

As shown in FIG. 12, through thermal oxidation, gate oxide film 126 is formed on reverse breakdown voltage holding layer 122 provided with p region 123, n$^+$ region 124, and p$^+$ region 125. In addition, during this thermal oxidation, an oxide film 11j is formed on the lower surface of SiC substrate 11. A temperature for thermal oxidation is, for example, around 1300° C.

As shown in FIG. 13, gate electrode 110 is formed on gate oxide film 126. For example, a polysilicon film is formed as gate electrode 110. When a polysilicon film is also deposited on oxide film 11*j*, this deposit may be removed.

Figure 14:
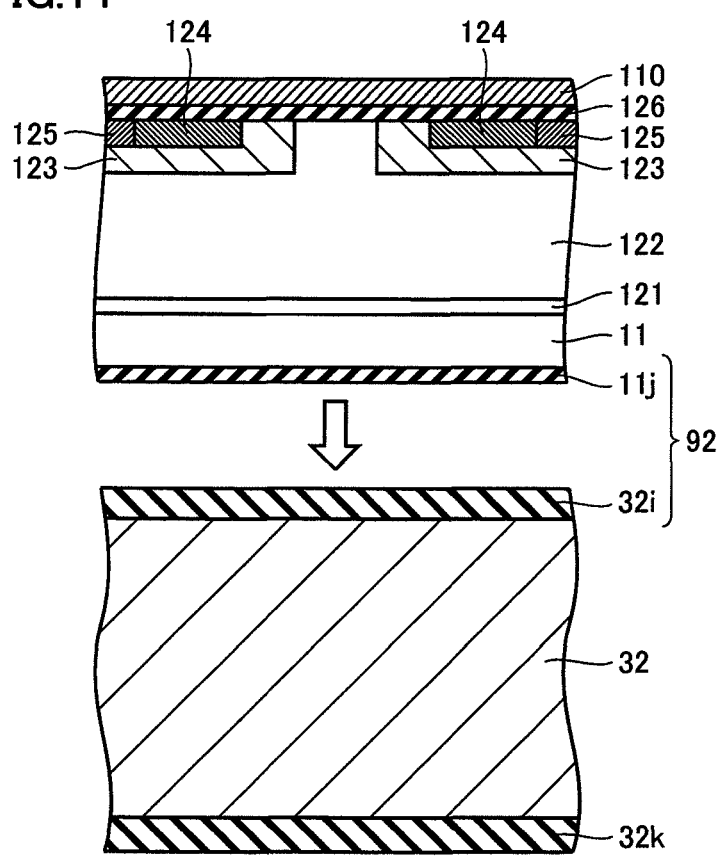
FIG. 14 is a cross-sectional view schematically showing an eleventh step in the method for manufacturing a silicon carbide semiconductor device in Embodiment 1 of the present invention.

Referring to FIG. 14, an Si substrate 32 (second support substrate) is prepared. Si substrate 32 is made of single crystal silicon. A size of Si substrate 32 is greater than the size of SiC substrate 11, and a maximum dimension thereof is, for example, not smaller than approximately 150 mm (6 inches). Si substrate 31 described above may be re-used as Si substrate 32.

Then, an interposing portion 92 made of a material different from each of silicon carbide and a material for Si substrate 32 (more generally, a material for the second support substrate) is prepared. In the present embodiment, interposing portion 92 made of an oxide is formed. Specifically, an oxide film 32*i* is formed on an upper surface of Si substrate 32. In addition, oxide film 11*j* on the lower surface of SiC substrate 11 is used as a part of interposing portion 92.

It is noted that, in the case where oxide film 32*i* is formed through thermal oxidation, an oxide film 32*k* may be formed also on a lower surface of Si substrate 32. A thermally oxidized film formed on Si substrate 32 has a thickness, for example, not smaller than 50 nm and not greater than 1 µm.

Then, as a step S70 (FIG. 2), SiC substrate 11 (single crystal substrate) is bonded onto Si substrate 32 (second support substrate) with interposing portion 92 being interposed. In the present embodiment, bonding between oxide film 11*j* and oxide film 32*i*, that is, SiO$_2$ bonding, is carried out.

Figure 15:
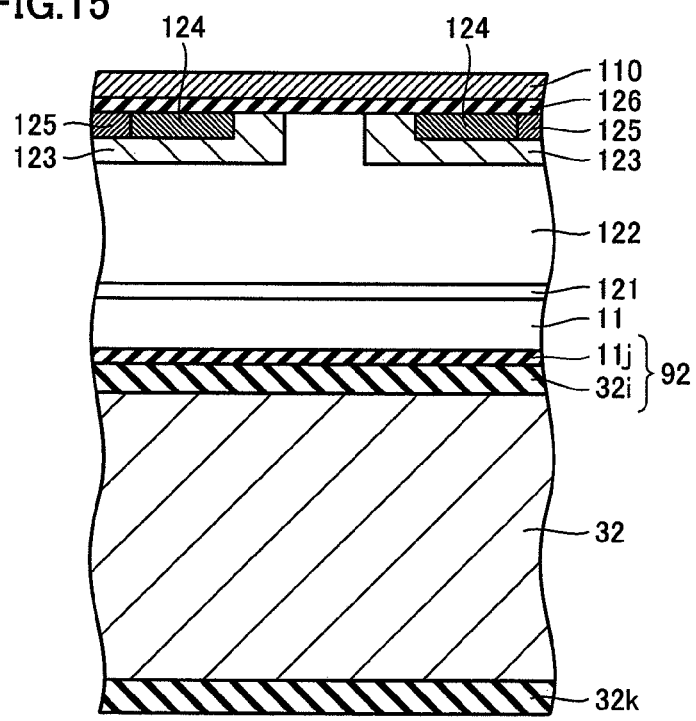
FIG. 15 is a cross-sectional view schematically showing a twelfth step in the method for manufacturing a silicon carbide semiconductor device in Embodiment 1 of the present invention.

Specifically, initially, each of oxide films 11*j* and 32*i* is activated as a result of irradiation with plasma. Then, each of oxide films 11*j* and 32*i* is subjected to megasonic cleaning. Then, as shown with an arrow in FIG. 14, oxide films 11*j* and 32*i* are brought closer to each other, so that both of them are bonded to each other as a result of van der Waals forces as shown in FIG. 15. Then, as oxide films 11*j* and 32*i* are heated to around 300° C., bonding force between them is strengthened. Bonding of SiC substrate 11 onto Si substrate 32 is thus achieved.

Figure 16:
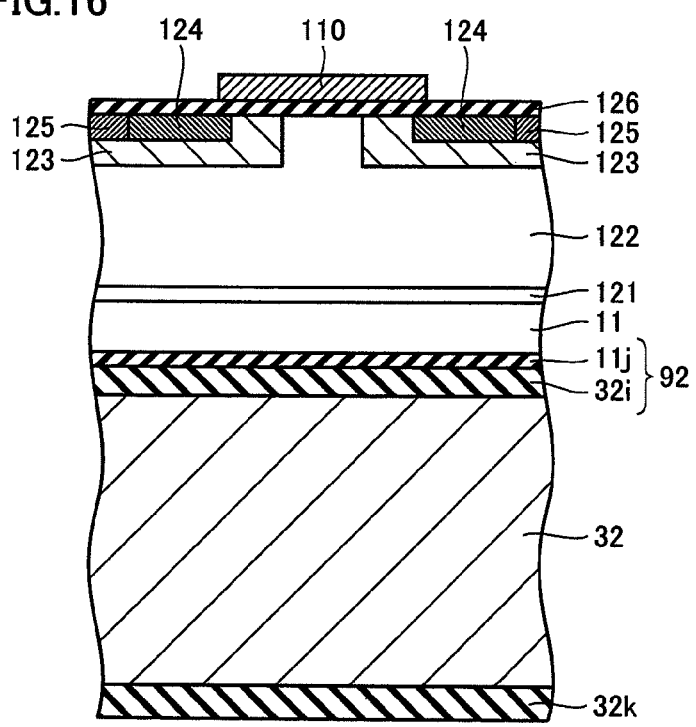
FIG. 16 is a cross-sectional view schematically showing a thirteenth step in the method for manufacturing a silicon carbide semiconductor device in Embodiment 1 of the present invention.
Figure 17:
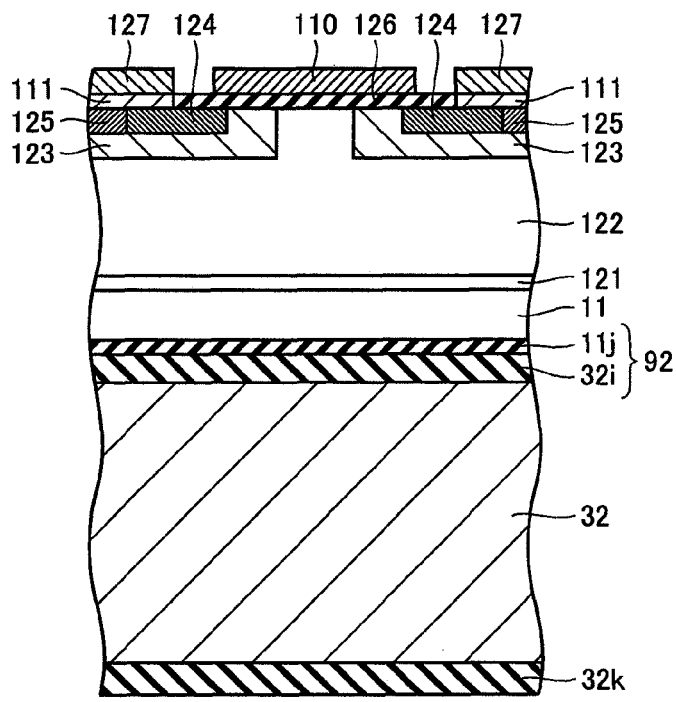
FIG. 17 is a cross-sectional view schematically showing a fourteenth step in the method for manufacturing a silicon carbide semiconductor device in Embodiment 1 of the present invention.

Then, as a step S80 (FIG. 2), in order to manufacture semiconductor device 100 (FIG. 1), process on SiC substrate 11 (single crystal substrate) bonded to Si substrate 32 is performed. Specifically, steps in a latter half of the semiconductor manufacturing process are performed on SiC substrate 11. Specifically, as shown in FIG. 16, gate electrode 110 is patterned. Then, as shown in FIG. 17, gate oxide film 126 is patterned. Then, source electrode 111 is formed through film formation, patterning, and heat treatment. This heat treatment is performed in order to establish ohmic contact, and it is, for example, alloying heat treatment. A temperature in the alloying heat treatment is, for example, around 1000° C. Then, upper source electrode 127 is formed on source electrode 111.

Figure 18:
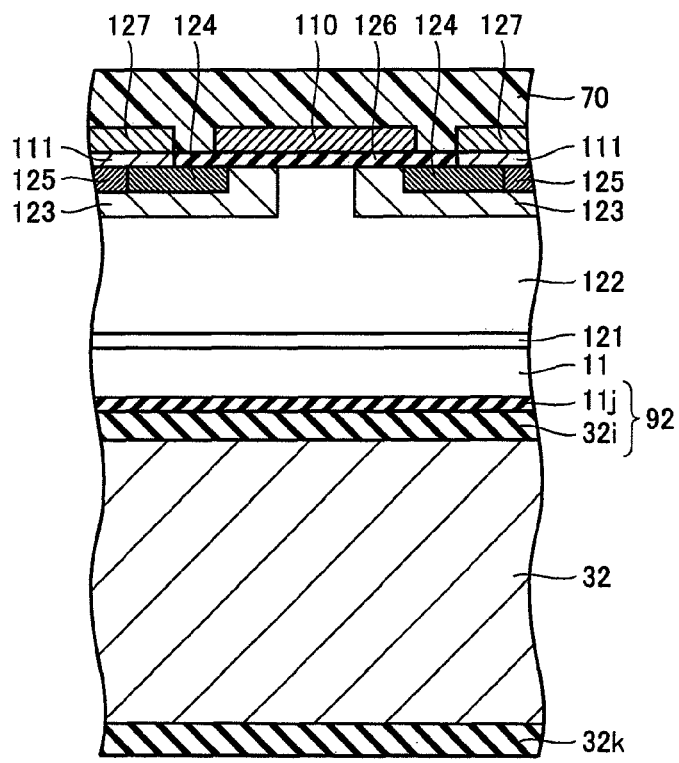
FIG. 18 is a cross-sectional view schematically showing a fifteenth step in the method for manufacturing a silicon carbide semiconductor device in Embodiment 1 of the present invention.
Figure 19:
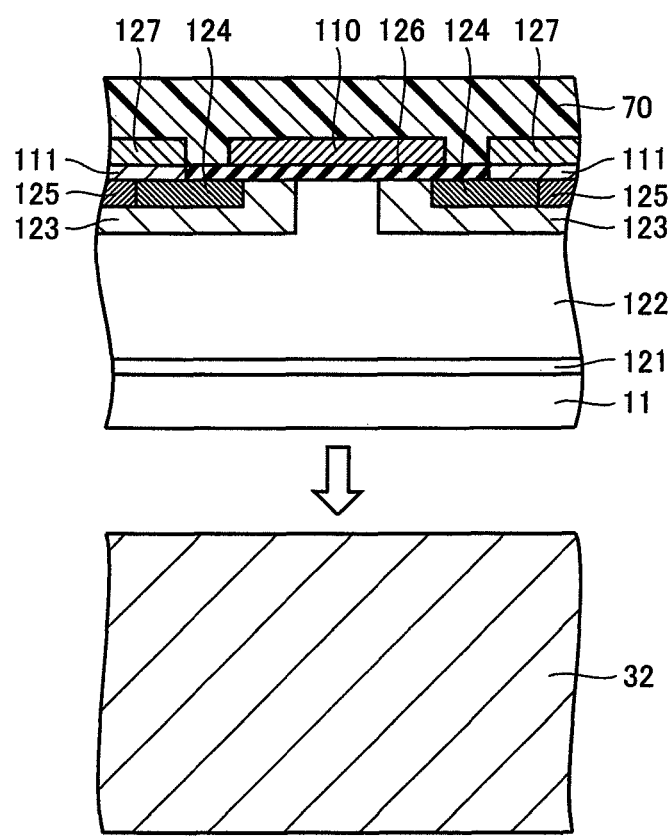
FIG. 19 is a cross-sectional view schematically showing a sixteenth step in the method for manufacturing a silicon carbide semiconductor device in Embodiment 1 of the present invention.

As shown in FIG. 18, as necessary, a resist layer 70 as a protection layer protecting a structure on the surface of SiC substrate 11 is formed. Then, as shown in FIG. 19, as a step S90 (FIG. 2), Si substrate 32 (second support substrate) is removed. Si substrate 32 is removed by removing interposing portion 92 (FIG. 17). As interposing portion 92 is removed, Si substrate 32 is separated from SiC substrate 11. Interposing portion 92 may be removed through wet etching using hydrofluoric acid as an etchant. Then, resist layer 70 is removed.

Referring again to FIG. 1, drain electrode 112 (FIG. 1) which is an ohmic electrode is foamed. Then, as a result of dicing, semiconductor device 100 is obtained.

According to the present embodiment, after Si substrate 31 is removed and before Si substrate 32 is bonded (FIG. 10), in step S60 (FIG. 2), SiC substrate 11 made of silicon carbide is subjected to heat treatment. Therefore, this SiC substrate 11 can be subjected to heat treatment at a high temperature which Si substrates 31 and 32 cannot withstand. In addition, heat treatment at a high temperature which interposing portions 91 and 92 cannot withstand can also be performed.

Furthermore, by using Si substrates 31 and 32, before and after this heat treatment, adaptation to a size of a substrate which can be handled by a standard semiconductor manufacturing apparatus is achieved. Specifically, by using Si substrates 31 and 32 having a size not smaller than approximately 150 mm, a semiconductor manufacturing apparatus adapted to a substrate having a size not smaller than approximately 150 mm can be used.

Moreover, in step S30 (FIG. 2), SiC substrate 11 is bonded onto Si substrate 31 with interposing portion 91 being interposed (FIGS. 6 and 7). Thus, SiC substrate 11 can be bonded without adhesion between silicon carbide and silicon which is a material for Si substrate 31.

Furthermore, in step S50 (FIG. 2), by removing interposing portion 91 (FIG. 9), Si substrate 31 can readily be detached as shown in FIG. 10. Interposing portion 91 can readily be removed through wet etching.

In addition, in step S20 (FIG. 2), oxide film 31*i* as a part of interposing portion 91 is formed on Si substrate 31. Thus, at least a part of interposing portion 91 can be formed through treatment of Si substrate 31. Moreover, since oxide film 31*i* made of an oxide is formed, at least a part of interposing portion 91 can be formed from an oxide layer. Oxide film 31*i* made of an oxide may be formed through thermal oxidation of Si substrate 31. Thus, an oxide layer as at least a part of interposing portion 91 can readily be formed.

Furthermore, in step S20 (FIG. 2), oxide film 11*i* as interposing portion 91 is formed on SiC substrate 11. Thus, at least a part of interposing portion 91 can be formed through treatment of SiC substrate 11. Oxide film 11*i* may be formed through thermal oxidation of SiC substrate 11. Thus, oxide film 11*i* as at least a part of interposing portion 91 can readily be formed.

In addition, in step S10 (FIG. 2), since Si substrate 31 (FIGS. 4 (A) and (B)) is made of single crystal silicon, planarity of Si substrate 31 can readily be enhanced. Since a uniform, thermally oxidized film can readily be formed on Si substrate 31 having single crystal structure, planarity of oxide film 31*i* (FIG. 6) formed in step S20 (FIG. 2) also becomes high. As planarity is thus high, strength of bonding (FIG. 6) in step S30 (FIG. 2) is enhanced.

Moreover, in step S40 (FIG. 2), impurities are implanted into SiC substrate 11, and in step S50 (FIG. 2), heat treatment for activating these impurities is performed. In heat treatment in step S50, since SiC substrate 11 has not yet been bonded to any of Si substrates 31 and 32 (FIG. 11), damage to Si substrate 31 or 32 attributed to heat treatment at a high temperature can be avoided.

Furthermore, since Si substrate 32 is removed in step S90 (FIG. 2), finally obtained semiconductor device 100 can have a small thickness. In contrast, during a manufacturing process, as SiC substrate 11 is supported by Si substrate 31 or 32, sufficient rigidity is ensured. Therefore, SiC substrate 11 prepared in step S10 (FIG. 2) can have a small thickness, for example, not greater than 150 µm. Thus, cost for SiC substrate 11 can be reduced. It is noted that, since there is also a step in part in which SiC substrate 11 is supported by neither of Si substrates 31 and 32, SiC substrate 11 preferably has a thickness not smaller than 100 µm.

In addition, in step S20 (FIG. 2), oxide film 11*i* is formed on SiC substrate 11, so that bonding of SiC substrate 11 to Si substrate 31 in step S30 (FIG. 2) can be carried out not directly but with oxide film 11*i* being interposed. Moreover, in such bonding, increase in undesirable impurity can be avoided.

Preferably, a degree of surface planarity of the lower surface of SiC substrate 11 (a surface opposed to Si substrate 31) prepared in step S10 (FIG. 2) is set to 1 nm or less. Thus, bonding strength between SiC substrate 11 and Si substrate 31 can be enhanced.

In addition, preferably, a degree of surface planarity of the upper surface of Si substrate 31 (a surface opposed to SiC substrate 11) prepared in step S10 (FIG. 2) is set to 1 nm or less. Thus, bonding strength between SiC substrate 11 and Si substrate 31 can be enhanced.

Further preferably, impurity concentration in each of SiC substrate 11 and Si substrate 31 prepared in step S10 (FIG. 2) is not higher than $1 \times 10^{11}$ atoms/cm$^2$. Thus, by lowering influence of an impurity on bonding in step S30, yield in bonding can be improved.

Further preferably, warpage of SiC substrate 11 is not greater than 30 µm in the case where SiC substrate 11 is about 75 mm (3 inches), and it is not greater than 45 µm in the case where SiC substrate 11 is about 100 mm (4 inches). Thus, bonding in step S30 is facilitated. In addition, by making initial warpage of SiC substrate 11 small, warpage of SiC substrate 11 after bonding to Si substrate 31 can also readily be suppressed. Therefore, accuracy in process in step S40 (FIG. 2) can be enhanced.

Further preferably, warpage of Si substrate 31 is not greater than 100 µm in the case where Si substrate 31 is about 150 mm (6 inches). Thus, bonding in step S30 is facilitated. In addition, by making initial warpage of Si substrate 31 small, warpage of Si substrate 31 after bonding to SiC substrate 11 can also readily be suppressed. Therefore, accuracy in process in step S40 (FIG. 2) can be enhanced.

Further preferably, Si substrate 32 is similar in shape to Si substrate 31, and more preferably, a position of SiC substrate 11 on Si substrate 31 and a position of SiC substrate 11 on Si substrate 32 are in registration as much as possible. With regard to an error in this registration, preferably, an error in each of an x direction and a y direction in the xy coordinate system is within 100 µm and a rotational error is within 1.5°. Thus, accuracy in process of SiC substrate 11 bonded onto Si substrate 32, in particular, accuracy in photolithography, can be enhanced.

Figure 2:
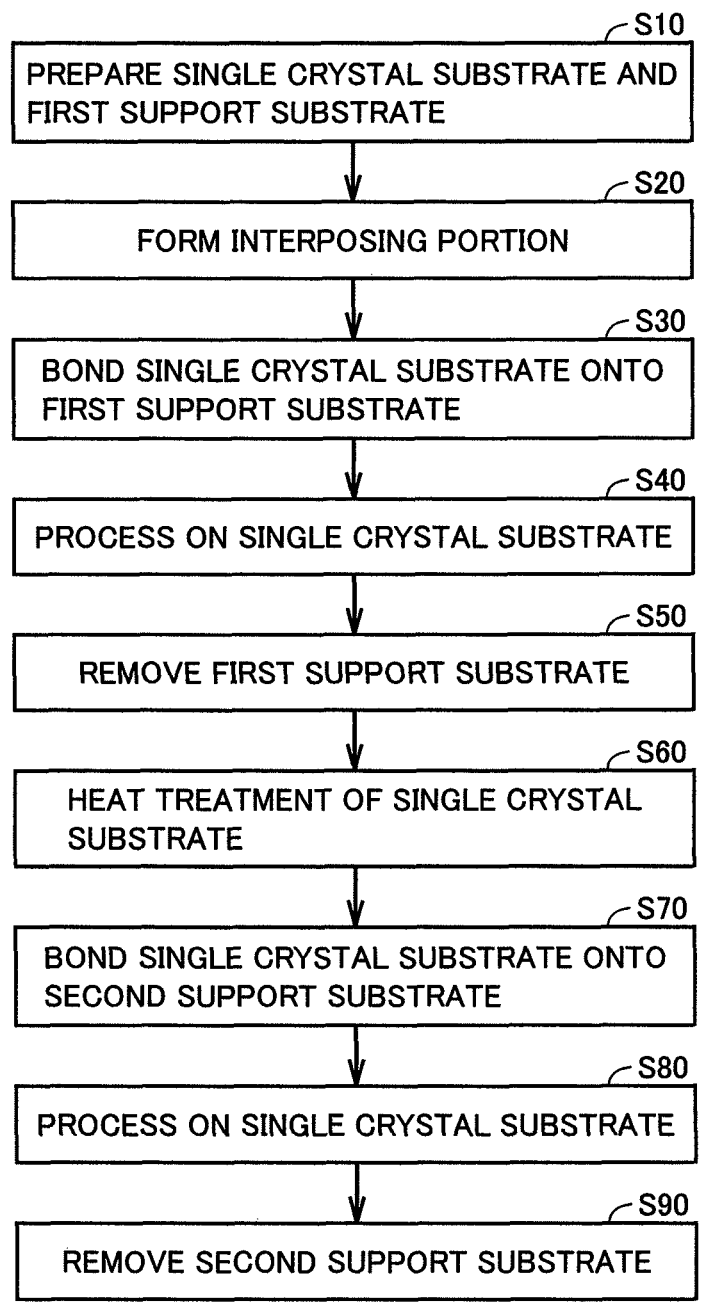
FIG. 2 is a flowchart schematically showing a method for manufacturing a silicon carbide semiconductor device in Embodiment 1 of the present invention.

Though SiC substrate 11 is bonded onto Si substrate 32 after film formation of gate electrode 110 (FIG. 13) in the present embodiment, this bonding may be carried out before film formation of gate electrode 110 (FIG. 13). It is noted that this bonding is carried out after heat treatment in step S60 (FIG. 2).

In addition, though both of oxide films 11*i* and 31*i* are formed as interposing portion 91 in step S20 (FIG. 2), only one of these may be formed.

Moreover, removal of Si substrate 31 in step S50 (FIG. 2) may be achieved by etching or grinding (what is called back grinding) of Si substrate 31, instead of separation of Si substrate 31 by removing interposing portion 91.

Furthermore, in step S80 (FIG. 2) or in a subsequent step, a passivation film may be formed on an upper surface of semiconductor device 100.

In addition, oxide film 31*i* (support-side-coating layer) or oxide film 11*i* (single-crystal-side-coating layer) may be formed in step S20 (FIG. 2) with a deposition method instead of a thermal oxidation method. Thus, there can be a wide selection of a material for interposing portion 91, and for example, an oxide or a nitride can also be employed. For example, silicon oxide can be employed as an oxide. For example, titanium nitride can be employed as a nitride. In this case, removal of interposing portion 91 can be achieved by wet etching using an acetic acid hydrogen peroxide solution as an etchant. This is also the case with formation of oxide film 32*i* (FIG. 14).

Preferably, before step S40, oxide film 31*i* is subjected to heat treatment at a temperature higher than a highest temperature in process of single crystal substrate 11 in step S40. Thus, SiC substrate 11 can be prevented from peeling off from Si substrate 31 during step S40. The reason for this is estimated to be degassing attributed to this heat treatment, from oxide film 31*i* formed through deposition. The highest temperature in step 40 is attained, for example, in heating up to about 500° C. associated with ion implantation. More preferably, this heat treatment is performed before single crystal substrate 11 and Si substrate 31 are bonded to each other.

Preferably, before step S40, oxide film 31*i* is subjected to heat treatment at 1100° C. or higher. This heat treatment is performed, for example, at a temperature not lower than 1100° C. and not higher than 1400° C. for 2 hours in a nitrogen atmosphere. Thus, SiC substrate 11 can be prevented from peeling off from Si substrate 31 during step S40. The reason for this is estimated to be degassing attributed to this heat treatment, from oxide film 31*i* formed through deposition. More preferably, this heat treatment is performed before single crystal substrate 11 and Si substrate 31 are bonded to each other.

Preferably, before step S80, oxide film 32*i* is subjected to heat treatment at a temperature higher than a highest temperature in a process of single crystal substrate 11 in step S80. Thus, SiC substrate 11 can be prevented from peeling off from Si substrate 32 during step S80. The reason for this is estimated to be degassing attributed to this heat treatment, from oxide film 32*i* formed through deposition. The highest temperature in step S80 is attained, for example, in heating up to about 1000° C. associated with an interlayer insulating film or heating up to about 800° C. associated with alloying of an electrode. More preferably, this heat treatment is performed before single crystal substrate 11 and Si substrate 32 are bonded to each other.

Preferably, before step S80, oxide film 32*i* is subjected to heat treatment at 1100° C. or higher. This heat treatment is performed, for example, at a temperature not lower than 1100° C. and not higher than 1400° C. for 2 hours in a nitrogen atmosphere. Thus, SiC substrate 11 can be prevented from peeling off from Si substrate 32 during step S80. The reason for this is estimated to be degassing attributed to this heat treatment, from oxide film 32*i* formed through deposition. More preferably, this heat treatment is performed before single crystal substrate 11 and Si substrate 32 are bonded to each other.

Furthermore, a substrate made of a material other than single crystal Si may be prepared instead of Si substrate 31, as a single crystal substrate in step S10 (FIG. 2). For example, this material is polycrystalline SiC, $SiO_2$, or sapphire. This is also the case with Si substrate 32.

Furthermore, in step S20 (FIG. 2), a surface of oxide film 31*i* or a support-side-coating layer instead thereof may be polished. Thus, strength of bonding to the support-side-coating layer can be enhanced. This polishing is particularly desirable in the case where planarity of the support-side-coating layer is likely to be low. The case where planarity of the support-side-coating layer is likely to be low refers, for example, to a case where a support-side-coating layer is formed with a deposition method or a case where a support-side-coating layer is formed on a substrate having polycrystalline structure. Preferably, polishing is carried out with CMP (Chemical Mechanical Polishing).

In addition, in step S20 (FIG. 2), a surface of oxide film 11$i$ or a single-crystal-side-coating layer instead thereof may be polished. Thus, strength of bonding to the single-crystal-side-coating layer can be enhanced. This polishing is particularly desirable in the case where planarity of the single-crystal-side-coating layer is likely to be low. The case where planarity of the single-crystal-side-coating layer is likely to be low refers, for example, to a case where a single-crystal-side-coating layer is formed with a deposition method. Preferably, polishing is carried out with CMP.

Moreover, what is called RCA cleaning may be carried out after polishing described above. Thus, strength of bonding can further be enhanced.

Furthermore, Si substrate 32 may be removed before heat treatment for establishing ohmic connection of source electrode 111. In this case, heat treatment of source electrode 111 can be performed at a temperature higher than a temperature which Si substrate 32 can withstand.

Embodiment 2

In the present embodiment, in the step of forming an interposing portion in step S20 (FIG. 2), the interposing portion is patterned. Specifically, oxide film 31$i$ of Si substrate 31 in Embodiment 1 is patterned to form a groove portion. Thus, as shown in FIGS. 20 (A) and (B), an oxide film 31$p$ (support-side-coating layer) having a groove portion TR is formed as at least a part of the interposing portion.

Then, as shown in FIGS. 21 (A) and (B), as step S30 (FIG. 2), substantially as in Embodiment 1, SiC substrate 11 (single crystal substrate) is bonded onto Si substrate 31 (first support substrate) with oxide films 31$p$ and 11$i$ as the interposing portion being interposed. In this bonding, a gap GP formed by patterning of the interposing portion, that is, patterning of groove portion TR, is formed between SiC substrate 11 and Si substrate 31. In addition, this bonding may be achieved such that gap GP communicates with the outside as shown in FIG. 21 (A). Here, the "outside" means a space located outside SiC substrate 11 in a plan view.

Since features are otherwise substantially the same as those in Embodiment 1 described above, the same or corresponding elements have the same reference characters allotted and description thereof will not be repeated.

According to the present embodiment, as shown in FIG. 21 (A), since gap GP communicating with the outside is provided, by externally supplying an etchant into gap GP during wet etching in step S50 (FIG. 2), the etchant can spread into a region lying between Si substrate 31 and SiC substrate 11 in a short period of time. Therefore, wet etching can efficiently be carried out.

Embodiment 3

Figure 22:
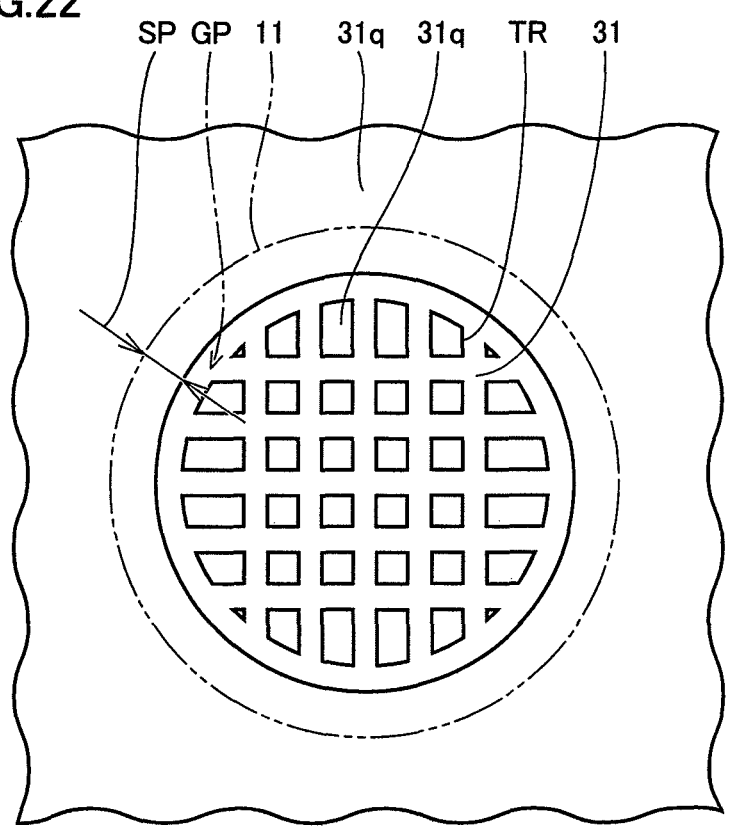
FIG. 22 is a plan view schematically showing one step in the method for manufacturing a silicon carbide semiconductor device in Embodiment 3 of the present invention.

In the present embodiment, patterning of the interposing portion in step S20 (FIG. 2) is different from that in Embodiment 2. Specifically, as shown in FIG. 22, an oxide film 31$q$ (support-side-coating layer) is formed as at least a part of the interposing portion.

Then, as step S30 (FIG. 2), substantially as in Embodiment 1, SiC substrate 11 (single crystal substrate) is bonded onto Si substrate 31 (first support substrate) with oxide films 31$q$ and 11$i$ as the interposing portion being interposed. This bonding is achieved such that gap GP similar to gap GP (FIG. 21) is sealed from the outside world as shown with arrangement of SiC substrate 11 in a plan view (a chain double dotted line in FIG. 22). In the plan view, gap GP is sealed across a dimension SP (FIG. 22), and preferably, dimension SP is not smaller than 10 μm and not greater than 20 μm.

Since features are otherwise substantially the same as those in either Embodiment 1 or 2 described above, the same or corresponding elements have the same reference characters allotted and description thereof will not be repeated.

According to the present embodiment, as gap GP is sealed, foreign matters can be prevented from entering gap GP. In addition, in subsequent wet etching, once an etchant reaches gap GP, the etchant promptly diffuses through gap GP. Therefore, wet etching can efficiently be carried out.

Moreover, since gap GP is sealed, unintended peeling-off of Si substrate 31 resulting from unintended introduction of an etchant into gap GP can be prevented.

Embodiment 4

In the present embodiment, patterning of the interposing portion in step S20 (FIG. 2) is different from that in Embodiment 2. Specifically, as shown in FIGS. 23 (A) and (B), an oxide film 31$r$ (support-side-coating layer) is formed as at least a part of the interposing portion.

Then, as shown in FIGS. 24 (A) and (B), as step S30 (FIG. 2), substantially as in Embodiment 1, SiC substrate 11 (single crystal substrate) is bonded onto Si substrate 31 (first support substrate) with oxide films 31$r$ and 11$i$ as the interposing portion being interposed. Even after bonding, an outer peripheral portion of SiC substrate 11 is not restricted by Si substrate 31 as a result of patterning of the interposing portion, that is, patterning of oxide film 31$r$.

Since features are otherwise substantially the same as those in Embodiment 1 or 2 described above, the same or corresponding elements have the same reference characters allotted and description thereof will not be repeated.

According to the present embodiment, an unnecessary portion of interposing portion 91 (FIG. 5) can be removed by patterning. In addition, since a gap is provided between the outer peripheral portion of SiC substrate 11 and Si substrate 31 as a result of this patterning, internal stress can be suppressed. Thus, a degree of warpage of SiC substrate 11 or Si substrate 31 in the structure in FIG. 24 (B) can be suppressed.

Embodiment 5

Figure 25:
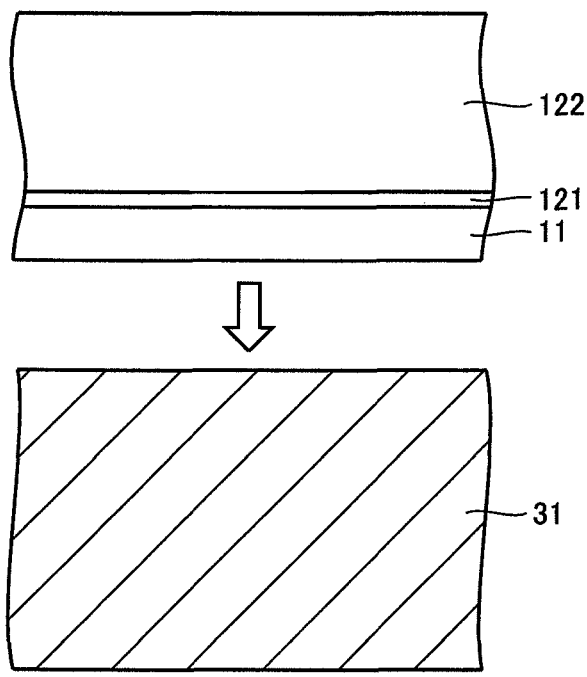
FIG. 25 is a cross-sectional view schematically showing a first step in the method for manufacturing a silicon carbide semiconductor device in Embodiment 5 of the present invention.
Figure 26:
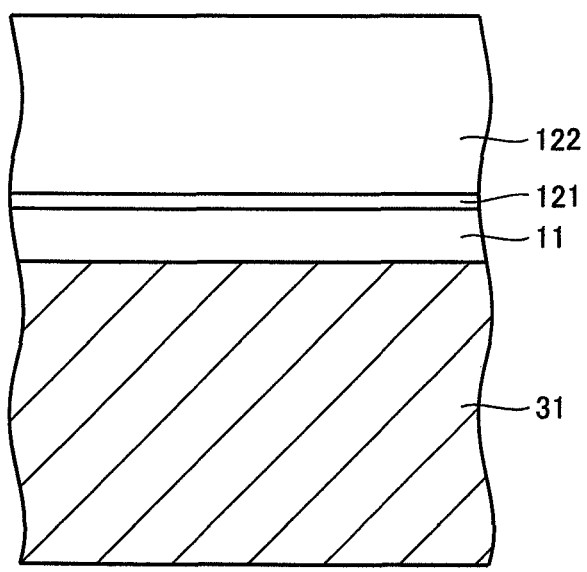
FIG. 26 is a cross-sectional view schematically showing a second step in the method for manufacturing a silicon carbide semiconductor device in Embodiment 5 of the present invention.

In the present embodiment, unlike Embodiments 1 to 4, step S20 (FIG. 2) is not performed. Namely, as shown in FIGS. 25 and 26, SiC substrate 11 is directly bonded onto Si substrate 31. Thus, bonding can be achieved without using interposing portion 91 (FIG. 6).

Figure 27:
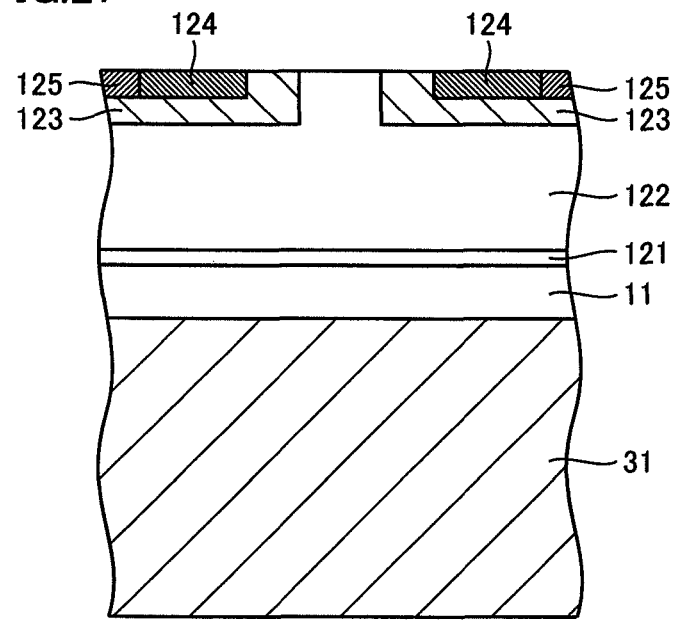
FIG. 27 is a cross-sectional view schematically showing a third step in the method for manufacturing a silicon carbide semiconductor device in Embodiment 5 of the present invention.

Then, as shown in FIG. 27, a step substantially the same as step S40 (FIG. 2) in Embodiment 1 is performed. Then, Si substrate 31 is removed. This removal can be achieved, for example, by back grinding. It is noted that a substrate made of an oxide may be employed instead of Si substrate 31, and in this case, the oxide may be removed through wet etching instead of back grinding. For example, $SiO_2$ or sapphire can be used as an oxide.

Since features are otherwise substantially the same as those in Embodiment 1 described above, the same or corresponding elements have the same reference characters allotted and description thereof will not be repeated.

Embodiment 6

Figure 28:
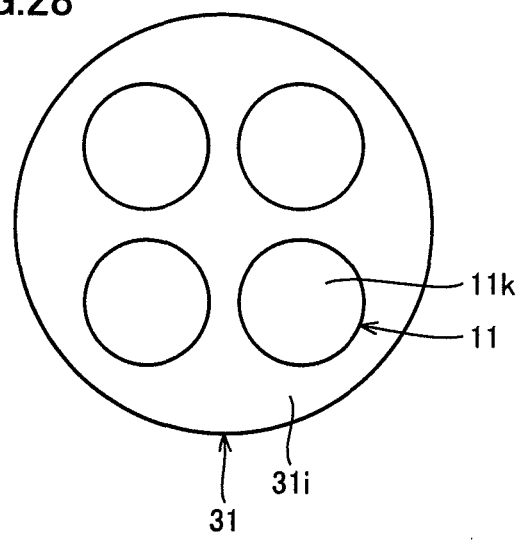
FIG. 28 is a plan view schematically showing one step in the method for manufacturing a silicon carbide semiconductor device in Embodiment 6 of the present invention.

In the present embodiment, as step S10 (FIG. 2), two or more SiC substrates 11 (single crystal substrates) are prepared. Therefore, in step S30, as shown in FIG. 28, each of a plurality of SiC substrates 11 is bonded onto Si substrate 31. It is noted that step S20 (FIG. 2) may be or may not be performed. In the case where it is performed, for example, the step of forming an interposing portion can be the same as that in any of Embodiments 1 to 3.

Since features are otherwise substantially the same as those in any of Embodiments 1 to 4 described above, the same or corresponding elements have the same reference characters allotted and description thereof will not be repeated.

According to the present embodiment (FIG. 28), as compared with the case where only a single SiC substrate 11 is employed (FIG. 7 (A)), a ratio of a portion formed from SiC substrate 11 made of silicon carbide on Si substrate 31 (or Si substrate 32) can be raised. Therefore, efficiency in manufacturing semiconductor device 100 (FIG. 1) can be enhanced.

(Additional Statement)

It is noted that a configuration in which conductivity types are interchanged in the silicon carbide semiconductor device exemplified in the description above, that is, a configuration in which p-type and n-type are interchanged, may also be employed.

A silicon carbide semiconductor device is not limited to a vertical DiMOSFET exemplified in the description above, and for example, it may be a trench MOSFET. In addition, it may be a MISFET (Metal Insulator Semiconductor Field Effect Transistor) other than the MOSFET. Moreover, the semiconductor device may be a transistor other than the MISFET, and for example, it may be a JFET (Junction Field Effect Transistor) or an IGBT (Insulated Gate Bipolar Transistor). Furthermore, the semiconductor device does not have to be a transistor, and for example, it may be a diode. The diode may be, for example, a Schottky barrier diode.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A method for manufacturing a silicon carbide semiconductor device, comprising the steps of:
    preparing at least one single crystal substrate made of silicon carbide and a first support substrate having a size greater than a size of each of said at least one single crystal substrate;
    bonding each of said at least one single crystal substrate onto said first support substrate;
    performing process on said at least one single crystal substrate bonded to said first support substrate;
    removing said first support substrate after the step of performing process on said at least one single crystal substrate;
    subjecting said at least one single crystal substrate to heat treatment after the step of removing said first support substrate;
    bonding each of said at least one single crystal substrate onto a second support substrate having a size greater than the size of each of said at least one single crystal substrate after the step of subjecting said at least one single crystal substrate to heat treatment;
    performing process on said at least one single crystal substrate bonded to said second support substrate; and
    removing said second support substrate.

2. The method for manufacturing a silicon carbide semiconductor device according to claim 1, further comprising the step of forming an interposing portion made of a material different from each of silicon carbide and a material for said first support substrate on at least any of each of said at least one single crystal substrate and said first support substrate, wherein
    said step of bonding each of said at least one single crystal substrate is performed by bonding each of said at least one single crystal substrate onto said first support substrate with said interposing portion being interposed.

3. The method for manufacturing a silicon carbide semiconductor device according to claim 2, wherein
    said step of removing said first support substrate includes the step of removing said interposing portion.

4. The method for manufacturing a silicon carbide semiconductor device according to claim 3, wherein
    said step of removing said interposing portion is performed through wet etching.

5. The method for manufacturing a silicon carbide semiconductor device according to claim 2, wherein
    said step of forming an interposing portion includes the step of forming on said first support substrate, a support-side-coating layer as at least a part of said interposing portion.

6. The method for manufacturing a silicon carbide semiconductor device according to claim 5, wherein
    said first support substrate is made of polycrystalline silicon carbide.

7. The method for manufacturing a silicon carbide semiconductor device according to claim 5, wherein
    said step of forming a support-side-coating layer includes the step of depositing said support-side-coating layer on said first support substrate.

8. The method for manufacturing a silicon carbide semiconductor device according to claim 7, further comprising the step of subjecting said support-side-coating layer to heat treatment at a temperature higher than a highest temperature in the step of performing process on said at least one single crystal substrate bonded to said first support substrate, before the step of performing process on said at least one single crystal substrate bonded to said first support substrate.

9. The method for manufacturing a silicon carbide semiconductor device according to claim 7, further comprising the step of subjecting said support-side-coating layer to heat treatment at a temperature not lower than 1100° C. before the step of performing process on said at least one single crystal substrate bonded to said first support substrate.

10. The method for manufacturing a silicon carbide semiconductor device according to claim 7, wherein
    said step of forming a support-side-coating layer includes the step of polishing a surface of said support-side-coating layer.

11. The method for manufacturing a silicon carbide semiconductor device according to claim 5, wherein
    said step of forming a support-side-coating layer is performed to form said support-side-coating layer made of oxide.

12. The method for manufacturing a silicon carbide semiconductor device according to claim 11, wherein
    said support-side-coating layer made of oxide is formed through thermal oxidation of said first support substrate.

13. The method for manufacturing a silicon carbide semiconductor device according to claim 12, wherein
    said first support substrate is made of single crystal silicon.

14. The method for manufacturing a silicon carbide semiconductor device according to claim 2, wherein
    said step of forming an interposing portion includes the step of forming a single-crystal-side-coating layer as at least a part of said interposing portion on each of said at least one single crystal substrate.

15. The method for manufacturing a silicon carbide semiconductor device according to claim 14, wherein
said step of forming a single-crystal-side-coating layer includes the step of depositing said single-crystal-side-coating layer on each of said at least one single crystal substrate.

16. The method for manufacturing a silicon carbide semiconductor device according to claim 15, wherein
said step of forming a single-crystal-side-coating layer includes the step of polishing a surface of said single-crystal-side-coating layer.

17. The method for manufacturing a silicon carbide semiconductor device according to claim 14, wherein
said single-crystal-side-coating layer is formed through thermal oxidation of each of said at least one single crystal substrate.

18. The method for manufacturing a silicon carbide semiconductor device according to claim 2, wherein
said step of forming an interposing portion includes the step of patterning said interposing portion.

19. The method for manufacturing a silicon carbide semiconductor device according to claim 18, wherein
said step of bonding each of said at least one single crystal substrate is performed to form a gap through said patterning of said interposing portion, between each of said at least one single crystal substrate and said first support substrate.

20. The method for manufacturing a silicon carbide semiconductor device according to claim 19, wherein
said step of bonding each of said at least one single crystal substrate is performed to seal said gap.

21. The method for manufacturing a silicon carbide semiconductor device according to claim 19, wherein
said step of bonding each of said at least one single crystal substrate is performed such that said gap communicates with outside.

22. The method for manufacturing a silicon carbide semiconductor device according to claim 1, wherein
said step of bonding each of said at least one single crystal substrate is performed by directly bonding each of said at least one single crystal substrate onto said first support substrate.

23. The method for manufacturing a silicon carbide semiconductor device according to claim 22, wherein
said first support substrate is made of oxide.

24. The method for manufacturing a silicon carbide semiconductor device according to claim 1, wherein
said step of performing process on said at least one single crystal substrate bonded to said first support substrate includes the step of implanting an impurity into said at least one single crystal substrate, and
said step of subjecting said at least one single crystal substrate to heat treatment is performed to activate said impurity.

25. The method for manufacturing a silicon carbide semiconductor device according to claim 1, wherein
said at least one single crystal substrate includes a plurality of single crystal substrates.

* * * * *